(12) United States Patent
Choi et al.

(10) Patent No.: US 7,830,699 B2
(45) Date of Patent: Nov. 9, 2010

(54) RESISTANCE VARIABLE MEMORY DEVICE REDUCING WORD LINE VOLTAGE

(75) Inventors: Byung-Gil Choi, Yongin-si (KR); Du-Eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 182 days.

(21) Appl. No.: 12/245,929

(22) Filed: Oct. 6, 2008

(65) Prior Publication Data

US 2009/0027956 A1 Jan. 29, 2009

Related U.S. Application Data

(63) Continuation-in-part of application No. 11/723,361, filed on Mar. 19, 2007, now Pat. No. 7,463,511.

(51) Int. Cl.
*G11C 11/00* (2006.01)
(52) U.S. Cl. .............. 365/148; 365/185.23; 365/185.05
(58) Field of Classification Search ................. 365/148, 365/185.23, 185.05
See application file for complete search history.

(56) References Cited

U.S. PATENT DOCUMENTS 6,337,824 B1 * 1/2002 Kono et al. ................. 365/207

2007/0258303 A1 * 11/2007 Kajitani et al. .............. 365/207
2009/0122611 A1 * 5/2009 Shimizu et al. ......... 365/185.11
2009/0207642 A1 * 8/2009 Shimano et al. ............... 365/72

FOREIGN PATENT DOCUMENTS

| KR | 2000-0062116 | | 10/2000 |
|---|---|---|---|
| KR | 1020050020356 | A | 3/2005 |
| KR | 1020050105546 | A | 11/2005 |
| KR | 1020070056667 | A | 6/2007 |

* cited by examiner

*Primary Examiner*—Tuan T. Nguyen
(74) *Attorney, Agent, or Firm*—Volentine & Whitt, PLLC

(57) ABSTRACT

A resistance variable memory device includes a memory cell array, a sense amplifier circuit, and a column selection circuit. The memory cell array includes a plurality of block units and a plurality of word line drivers, where each of the block units is connected between adjacent word line drivers and includes a plurality of memory blocks. The sense amplifier circuit includes a plurality of sense amplifier units, where each of the sense amplifier units provides a read current to a corresponding block unit and includes a plurality of sense amplifiers. The column selection circuit is connected between the memory cell array and the sense amplifier circuit and selects at least one of the plurality of memory blocks in response to a column selection signal to apply the read current from the sense amplifier circuit to the selected memory block.

7 Claims, 15 Drawing Sheets

RESISTANCE VARIABLE MEMORY DEVICE REDUCING WORD LINE VOLTAGE

CROSS-REFERENCE TO RELATED APPLICATIONS

This is a continuation-in-part (CIP) of U.S. patent application Ser. No. 11/723,361, filed Mar. 19, 2007, the disclosure of which is hereby incorporated herein by reference in its entirety. In addition, a claim of priority is made to Korean Patent Application No. 10-2008-0009214, filed Jan. 29, 2008, and Korean Patent Application No. 10-2006-0033305, filed Apr. 12, 2006, the disclosures of both of which are hereby incorporated herein by reference in their entireties.

SUMMARY

The present invention disclosed herein relates to a semiconductor memory device, and more particularly, to a resistance variable memory device.

A resistance variable memory device is a nonvolatile memory device stores data by relying the temperature induced variable resistance of a resistance variable element of the device.

FIG. 1 is a view of a memory cell of a resistance variable memory device. Referring to FIG. 1, a memory cell 10 includes a memory element 11 and a select element 12. The memory element 11 is connected between a bit line BL and the select element 12, and the select element 12 is connected between the memory element 11 and a ground.

The memory element 11 includes a resistance variable material GST. The resistance variable material GST is a variable resistor such as Ge—Sb—Te (i.e., a compound including germanium (Ge), antimony (Sb), and tellurium (Te)). The resistance variable material GST can be programmed into any one of two stabilized states, that is, a crystal state and an amorphous state according to a temperature. The resistance variable material GST is changed to a crystal state or an amorphous state according to a current supplied through the bit line BL. The resistance variable memory device programs data using such a characteristic of the resistance variable material GST.

The select element 12 includes an NMOS transistor NT. The NMOS transistor NT includes a gate connected with a word line WL. When a predetermined voltage is applied to the word line WL, the NMOS transistor NT is turned on. When the NMOS transistor NT is turned on, the memory element 11 receives a current through the bit line BL. In FIG. 1, the memory element 11 is connected between the bit line BL and the select element 12, however, the select element 12 may be connected between the bit line BL and the memory element 11.

FIG. 2 is a view of another memory cell of a resistance variable memory device. Referring to FIG. 2, a memory cell 20 includes a memory element 21 and a select element 22. The memory element 21 is connected between a bit line BL and the select element 22, and the select element 22 is connected between the memory element 21 and a ground. The memory element 21 is the same as the memory element 11 illustrate in FIG. 1.

The select element 22 includes a diode D. The diode D includes an anode connected with the memory element 21 and a cathode connected with a word line WL. When a voltage difference between the anode and the cathode of the diode D becomes higher than a threshold voltage of the diode D, the diode D is turned on. When the diode D is turned on, a current is supplied to the memory element 21 through the bit line BL.

FIG. 3 is a graph illustrating the characteristic of the resistance variable material GST illustrated in FIGS. 1 and 2. In FIG. 3, reference numeral 1 represents a condition for allowing the resistance variable material GST to become an amorphous state, and reference numeral 2 represents a condition for a crystal state.

Referring to FIG. 3, the resistance variable material GST is heated at a temperature higher than a melting temperature Tm by supplying a current for T1 and quickly quenched to become an amorphous state. The amorphous state is generally called a reset state and stores data '1'. On the other hand, the resistance variable material GST is heated at a temperature higher than a crystallization temperature Tc and lower than a melting temperature Tm for T2 longer than T1 and slowly quenched to become a crystal state. The crystal state is generally called a set state and stores data '0'. A resistance of the memory cell is changed according to an amorphous volume of the resistance variable material GST. The resistance of the memory cell is high in an amorphous state and low in a crystal state.

The resistance variable memory device supplies a program current to the selected memory cell during a program operation. The selected memory cell is programmed to the reset state or the set state according to the program current. A reset current is a current for programming the memory cell to the reset state, and a set current is a current for programming the memory cell to the set state. That is, the set current makes the resistance variable material GST the crystal state, and the reset current makes the resistance variable material GST the amorphous state.

As shown in FIG. 3, in order to make the resistance variable material GST the crystal state, the set current corresponding to a temperature between Tc and Tm should be supplied to the memory cell for T2. In order to make the resistance variable material GST the amorphous state, the reset current corresponding to a temperature of Tm or higher should be supplied to the memory cell for T1. That is, the set current and the reset current should have the amount and applying time adequate for a state change of the resistance variable material GST. Generally, the reset current is larger than the set current, and the set current has its applying time longer than the reset current.

The memory cell array of the resistance variable memory device includes a plurality of memory cells. Each of the memory cells is connected with the word line and the bit line. A plurality of memory cells are connected with one word line. The memory cells of a row direction are selected according to a voltage level of the word line. When the NMOS transistor NT (refer to FIG. 1) is included in the memory cell, the memory cells of a row direction are selected according to the word line voltage of a high level. When the diode D (refer to FIG. 2) is included in the memory cell, the memory cells of a row direction are selected according to the word line voltage of a low level. When the memory cell includes the diode as the select element, the word line is connected with the cathode of the diode.

When a program current or a read current is applied to the plurality of memory cells connected with one word line, a voltage level of the word line may undesirably increase. This is caused by a parasitic resistance and a parasitic capacitor of the word line. Herein, a voltage level of the word line increases as many memory cells are connected with the word line. This has caused a decrease in the program and read characteristics of the resistance variable memory device.

As mentioned above, the present invention disclosed herein relates to a semiconductor memory device, and more particularly, to a resistance variable memory device.

In particular, according to an aspect of the present invention, which includes a memory cell array, a sense amplifier circuit, and a column selection circuit. The memory cell array includes a plurality of block units and a plurality of word line drivers, where each of the block units is connected between adjacent word line drivers and includes a plurality of memory blocks. The sense amplifier circuit includes a plurality of sense amplifier units, where each of the sense amplifier units provides a read current to a corresponding block unit and includes a plurality of sense amplifiers. The column selection circuit is connected between the memory cell array and the sense amplifier circuit and selects at least one of the plurality of memory blocks in response to a column selection signal to apply the read current from the sense amplifier circuit to the selected memory block.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, the present invention will be described by way of examples, i.e., by way of non-limiting embodiments of the invention.

Figure 1:
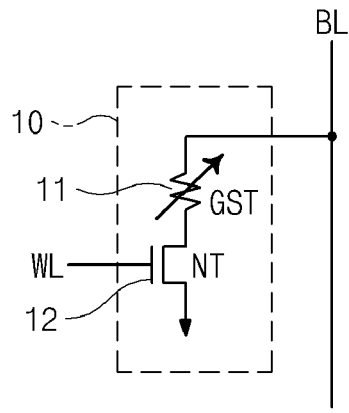
FIG. 1 is a view of a memory cell of a resistance variable memory device.
Figure 2:
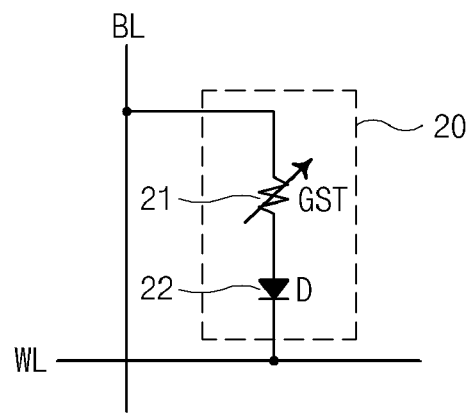
FIG. 2 is a view of another memory cell of a resistance variable memory device.
Figure 3:
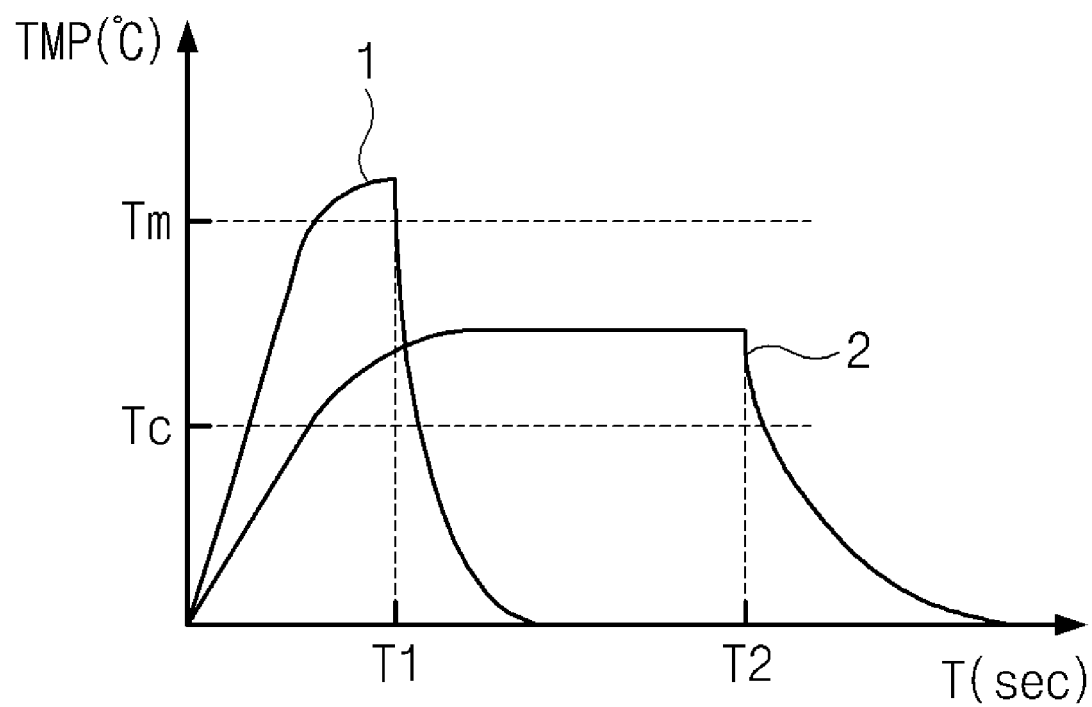
FIG. 3 is a graph illustrating the characteristic of a resistance variable material.
Figure 4:
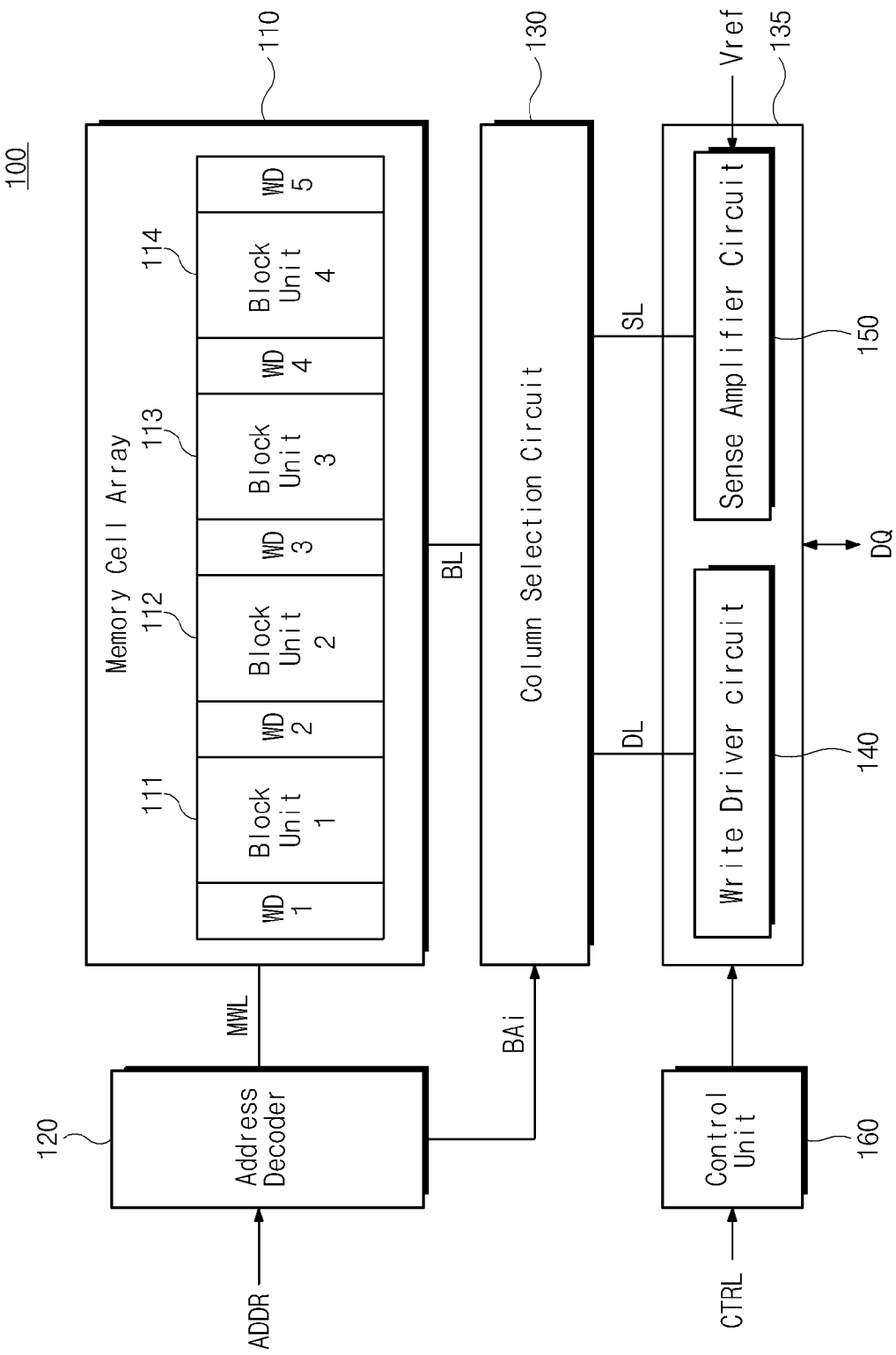
FIG. 4 is a block diagram of a resistance variable memory device according to the present invention.

FIG. 4 is a block diagram of a resistance variable memory device according to an embodiment of the present invention. In the example of FIG. 4, the resistance variable memory device 100 includes a memory cell array 110, an address decoder 120, a column selection circuit 130, a data input/output circuit 135, and a control unit 160. The data input/output circuit 135 includes a write driver circuit 140 and a sense amplifier circuit 150.

The memory cell array 110 is connected with a main word line MWL and a bit line BL. The memory cell array 110 includes a plurality of block units 111, 112, 113 and 114 and a plurality of word line drivers WD1~WD5. The block units 111~114 are juxtaposed with the word line drivers WD1~WD5 such that each block unit is located between two word line drivers as shown in FIG. 4. Also, each of the block units 111~114 includes a plurality of memory blocks (not shown).

The address decoder 120 decodes an externally supplied address ADDR. The address ADDR includes a row address RA and a column address CA. The address decoder 120 selects the main word line MWL according to the row address RA. In addition, the address decoder 120 outputs a column selection signal BAi according the column address CA to the column selection circuit 130. As explained below, the column selection circuit selects the bit line BL according to the column selection signal BAi.

The column selection circuit 130 is connected with the memory cell array 110 through the bit line BL and with the data input/output circuit 135 through a data line DL and a sensing line SL. The column selection circuit 130 electrically connects the data line DL or the sensing line SL with the selected bit line BL in response to the column selection signal BAi.

The data input/output circuit 135 includes the write driver circuit 140 and the sense amplifier circuit 150. The write driver circuit 140 provides a program current to the memory cell array 110 through the data line DL in a program operation. The sense amplifier unit 150 provides a read current to the memory cell array 110 through the sensing line SL in a read operation.

The write driver circuit 140 receives a program pulse and data and provides a program current to the data line DL. The program pulse is input from the control unit 160. In the example of this embodiment, the program pulse includes a set pulse P_SET and a reset pulse P_RST, and the program current includes a set current I_SET and a reset current I_RST. The write driver circuit 140 generates the set current I_SET in response to the set pulse P_SET when data '0' is input, and generates the reset current I_RST in response to the reset pulse P_RST when data '1' is input.

During a read operation, the sense amplifier circuit 150 provides a read current (or a bias current) to the memory cell array 110 through the sensing line SL, and compares a voltage of the sensing line SL with a reference voltage Vref to read data stored in a memory cell. Here, the reference voltage Vref is provided from a reference voltage generating circuit (not shown).

The control unit 160 generates a signal for controlling the data input/output circuit 135 in response to a control signal CTRL. For example, the control unit 160 provides the program pulses P_SET and the P_RST for generating a program current to the write driver circuit 140 in a program operation. The control unit 160 may also provide the bias signal for generating the read current to the sense amplifier circuit 150 in the read operation.

In a typical resistance variable memory device including a diode in a memory cell, when a program current or a read current is applied to the plurality of memory cells connected with one word line, a voltage level of the word line may undesirably increase. The increase in a word line voltage may decrease the program and read characteristics of the resistance variable memory device.

In the resistance variable memory device 100 according to an embodiment of the present invention, the memory cell array 110 is divided into the plurality of block units 111~114, and the word line driver is located between the block units, thereby minimizing an increase in a word line voltage in program and read operations. Hereinafter, a programming method and a reading method of the resistance variable memory device 100 according to an embodiment of the present invention will be described in detail.

Figure 5:
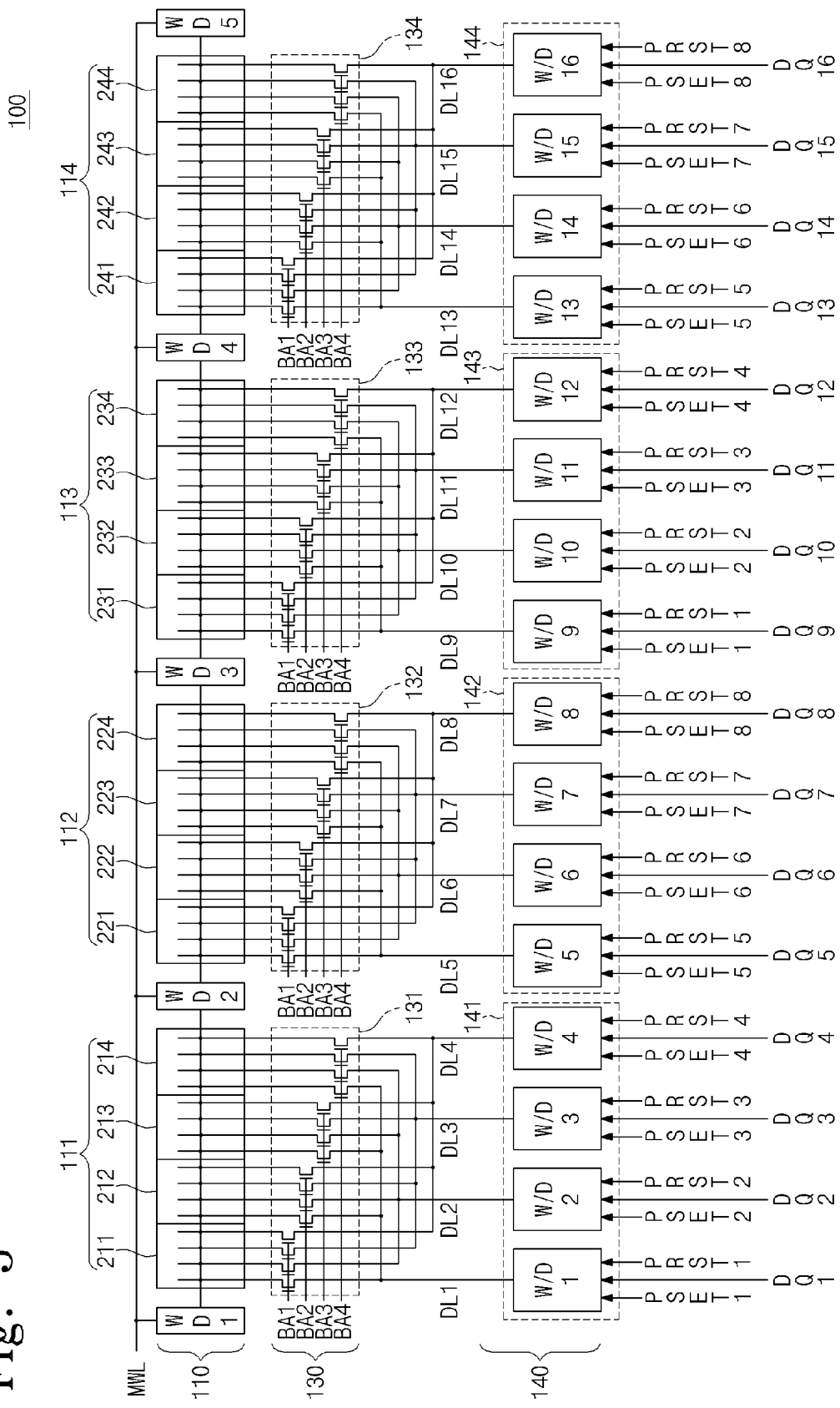
FIG. 5 is a block diagram illustrating a programming method of the resistance variable memory device illustrated in FIG. 4.

FIG. 5 is a block diagram illustrating in more detail parts of the resistance variable memory device illustrated in FIG. 4 according to an embodiment of the present invention. FIG. 5 exemplarily illustrates the memory cell array, the column selection circuit, and the write driver circuit illustrated in FIG. 4. Although FIG. 5 illustrates one main word line MWL, the resistance variable memory device actually has a plurality of main word lines.

Referring to FIG. 5, the memory cell array 110 includes the first through fourth block units 111~114 and the first through fifth word line drivers WD1~WD5. Each block unit is located between the adjacent word line drivers, and includes four memory blocks. For example, the first block unit 111 is located between the first and second word line drivers WD1 and WD2, and includes the first through fourth memory blocks 211~214. FIG. 5 also illustrates memory blocks 221~224 of block unit 112, memory blocks 231~234 of block unit 113, and memory blocks 241~244 of block unit 114. Each of the memory blocks includes a plurality of memory cells as discussed next in connection with FIG. 6.

Figure 6:
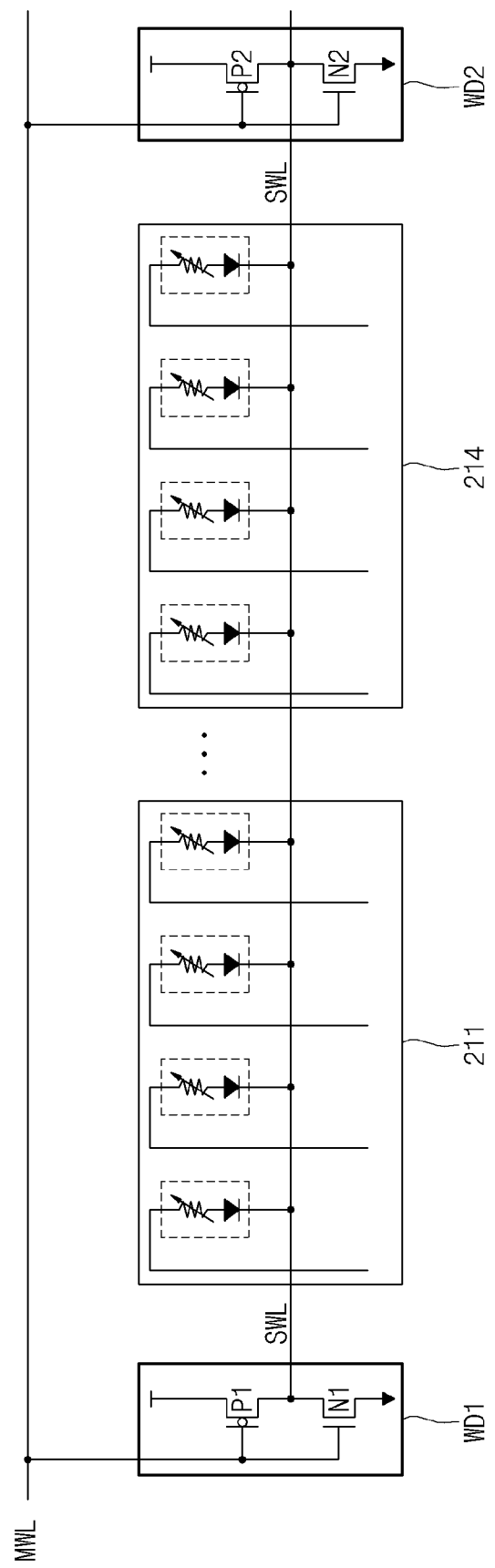
FIG. 6 is a circuit diagram of the memory cell array illustrated in FIG. 5.

FIG. 6 exemplarily illustrates the first block unit illustrated in FIG. 5. Referring to FIG. 6, the first and second word line drivers WD1 and WD2 are connected between the main word line MWL and a sub word line SWL. Each of the word line drivers WD1 and WD2 includes a PMOS transistor (P1 and P2, respectively) and an NMOS transistor (N1 and N2, respectively). The PMOS transistor and the NMOS transistor include gates connected with the main word line MWL and drains connected with the sub word line SWL.

The sub word line SWL is driven according to a voltage level of the main word line MWL. When the main word line MWL has a voltage of a high level, the sub word line SWL has a voltage of a low level. On the other hand, when the main word line MWL has a voltage of a low level, the sub word line SWL has a voltage of a high level.

The sub word line SWL that connects the first and second word line drivers WD1 and WD2 with each other is connected with the first through fourth memory blocks 211~214. The first memory block 211 includes a plurality of memory cells connected with the sub word line SWL. Each of the memory cells includes a memory element and a select element. The memory element includes a resistance variable material GST and the select element includes a diode D.

Referring to FIG. 5 again, the column selection circuit 130 is connected between the bit line BL and the data line DL. The column selection circuit 130 connects the data line with the selected bit line in response to the column selection signal BAi. The column selection circuit 130 includes first through fourth column selection units 131~134. The first through fourth column selection units 131~134 are connected with the first through fourth block units 111~114, respectively.

Each of the column selection units includes a plurality of NMOS transistors, and receives the first through fourth column selection signals BA1~BA4. For example, the first column selection unit 131 selects the first memory block 211 in response to the first column selection signal BA1 and selects the second memory block 212 in response to the second column selection signal BA2.

The write driver circuit 140 receives program pulses and data, and provides a program current to the data line DL. Referring to FIG. 5, the write driver circuit 140 includes first through fourth write driver units 141~144. Each of the write driver units provides the program current to the corresponding block unit. For example, the first write driver unit 141 provides the program current to the first block unit 111, and the second write driver unit 142 provides the program current to the second block unit 112.

Each of the write driver units 141~144 includes four write drivers. For example, the first write driver unit 141 includes first through fourth write drivers W/D1~W/D4. Also illustrated in FIG. 5 are the write drivers W/D5~W/D8 of the write drive unit 142, write drivers W/D9~W/D12 of the write drive unit 143, and write drivers W/D13~W/D16 of the write drive unit 144. Each of the write drivers may be structurally and operationally identical.

Figure 7:
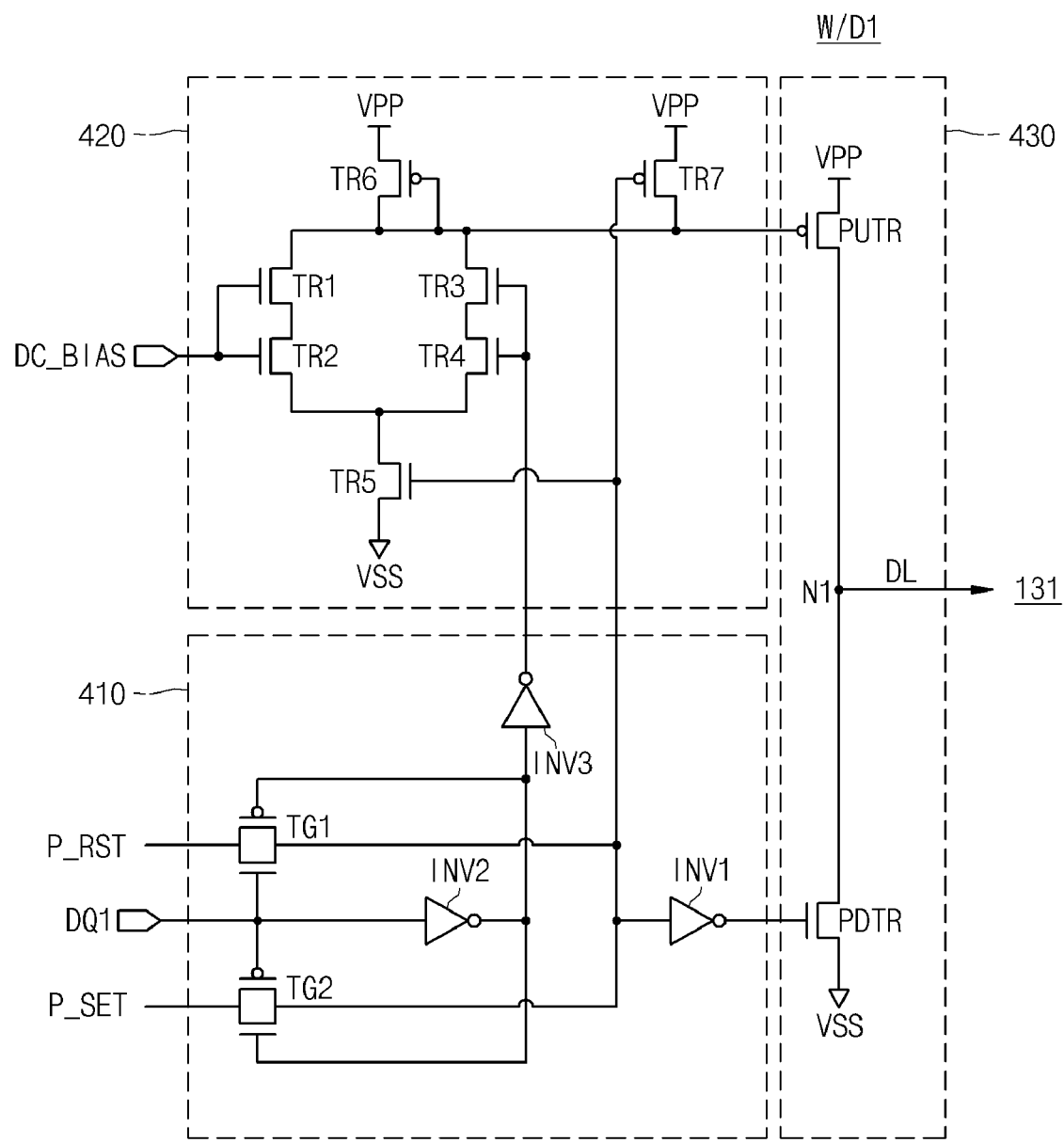
FIG. 7 is a circuit diagram of the write driver illustrated in FIG. 5.

FIG. 7 exemplarily illustrates the first write driver W/D1. Referring to FIG. 7, the write driver W/D1 includes a pulse control circuit 410, a current control circuit 420, and a current driver circuit 430. The pulse control circuit 410 includes first and second transfer gates TG1 and TG2 and first through third inverters INV1~INV3. The current control circuit 420 includes first through seventh transistors TR1~TR7. Here, the first through fifth transistors TR1~TR5 are NMOS transistors and the sixth and seventh transistors TR6 and TR7 are PMOS transistors. The current driver circuit 430 includes a pull-up transistor PUTR and a pull-down transistor PDTR.

When the input data DQ1 is '0', the second transfer gate TG2 of the pulse control circuit 410 is turned on and the third and fourth transistors TR3 and TR4 of the current control circuit 420 are turned off. The fifth transistor TR5 is turned on and the seventh transistor TR7 and the pull-down transistor PDTR are turned off by a set pulse P_SET1. Here, the current that flows through the transistors TR1, TR2, TR5 and TR6 constituting a first current path flows through the pull-up transistor PUTR due to a current mirror effect. The current that flows through the pull-up transistor PUTR is a set current I_SET1 and is provided to the selected memory cell MC through the data line DL1.

Next, when the input data DQ1 is '1', the first transfer gate TG1 of the pulse control circuit 410 and the third and fourth transistors TR3 and TR4 of the current control circuit 420 are turned on. The fifth transistor TR5 is turned on and the seventh transistor TR7 and the pull-down transistor PDTR are turned off by the reset pulse P_RST1. Here, the current that flows through the transistors TR1, TR2, TR5 and TR6 constituting the first current path and the transistors TR3, TR4, TR5 and TR6 constituting a second current path flows through the pull-up transistor PUTR by the current mirror effect. The current that flows through the pull-up transistor PUTR is a reset current I_RST1 and is provided to the selected memory cell MC through the data line DL1.

Here, the reset current I_RST1 has a larger current value than the set current I_SET1. Also, the reset pulse P_RST1 has a smaller pulse width than the set pulse P_SET1. Therefore, the reset current I_RST1 has a larger current value and a smaller pulse width than the set current I_SET1. The selected memory cell MC is programmed to the reset state or the set state by the reset current I_RST1 or the set current I_SET1, respectively.

Referring to FIG. 5 again, the first through fourth write driver units 141~144 provide a program current to the first through fourth block units 111~114 respectively. When the first column selection signal BA1 is activated, a program current is provided to the first memory blocks 211, 221, 231 and 241 in the block unit 111. When the second column selection signal BA2 is activated, a program current is provided to the second memory blocks 212, 222, 232 and 242 in the block unit 112.

Various programming methods may be adopted for applying the program pulses P_SET and P_RST to the resistance variable memory device 100 illustrated in FIG. 5. For example, the resistance variable memory device 100 can be utilized to simultaneously program 16-bit data in selected memory cells. This will be described later in detail with reference to FIG. 8.

Also, to reduce program current applied at any given time, the resistance variable memory device 100 can be programmed 8 times on a 2-bit basis, 4 times on a 4-bit basis, or 2 times on an 8-bit basis. Herein, this is referred to as "a multiprogramming method". The multiprogramming method includes an x2 programming method, an x4 programming method, an x8 programming method, and so on, according to the number of the memory cells programmed simultaneously. A multiprogramming method will be described later in detail with reference to FIGS. 9 and 10.

Here, 2-bit data, 4-bit data, and 8-bit data respectively correspond to one program pulse and are simultaneously programmed. The x2 programming method reduces the program current applied at a time to ⅛, the x4 programming method reduces the program current applied at a time to ¼, and the x8 programming method reduces the program current applied at a time to ½. These multiprogramming methods can also prevent a decrease in the programming characteristic caused by an increase in a voltage of the sub word line.

In the resistance variable memory device 100 illustrated in FIG. 5, the memory cell array 110 is divided into the plurality of block units 111~114, and the write driver circuit 140 is divided into the plurality of write driver units 141~144 to correspond to the block units 111~114 respectively. The resistance variable memory device 100 includes the column selection units to electrically connect the block units with the write driver units respectively. The resistance variable memory device 100 having such a construction can efficiently adopt a multiprogramming method. According to an embodiment of the present invention, a voltage of the sub word line can be prevented from increasing during the program operation. This will be described in detail with reference to FIGS. 8 through 10.

Figure 8:
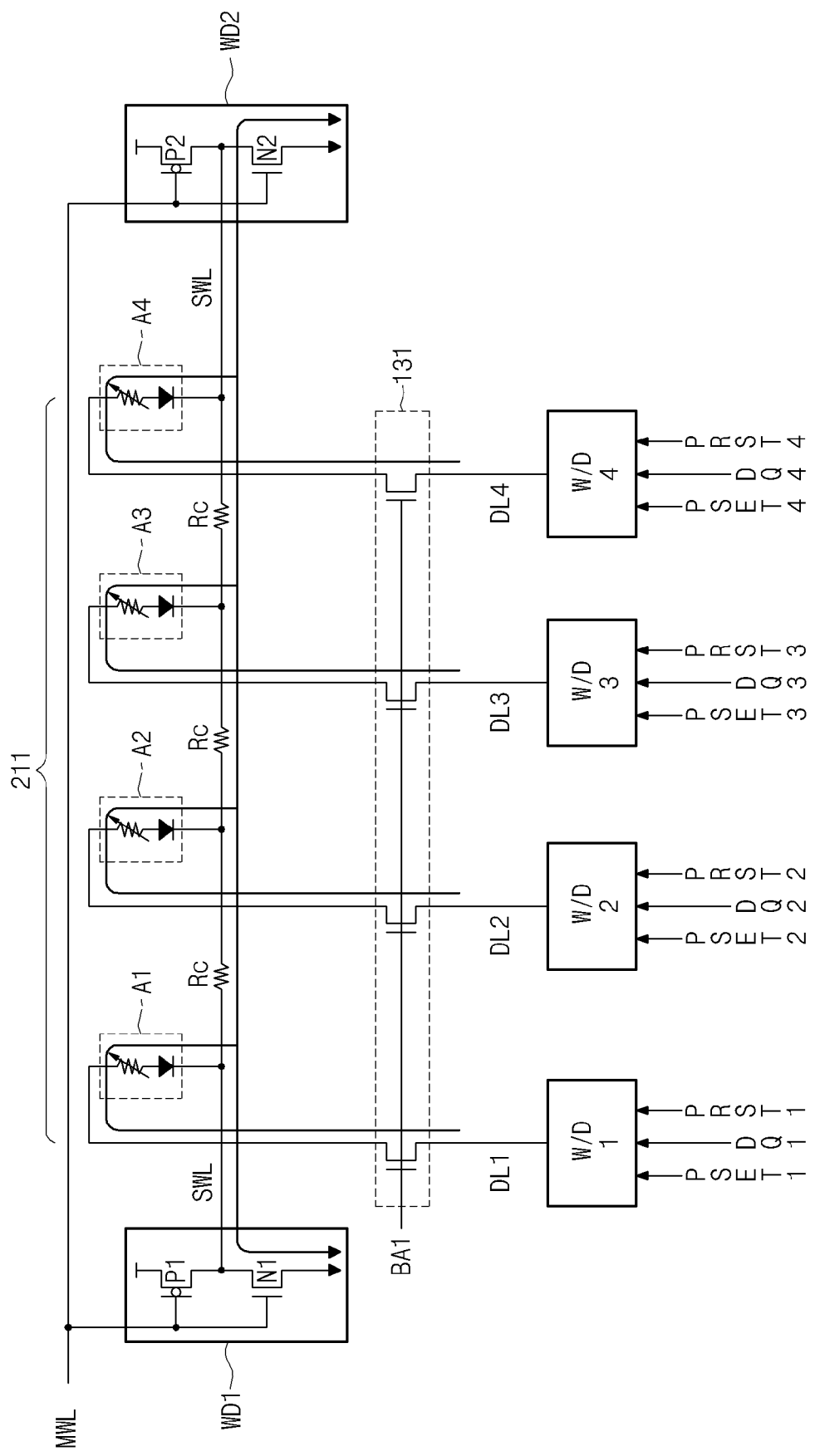
FIG. 8 illustrates that 16-bit data is simultaneously programmed in the resistance variable memory device illustrated in FIG. 5.

FIG. 8 is a diagram for use in describing the case where 16-bit data is simultaneously programmed. In FIG. 8, the first column selection signal BA1 is activated and 4-bit data is simultaneously programmed in the first memory block 211 through the first through fourth write drivers W/D1~W/D4. Each of the other first memory blocks 221, 231 and 241 is simultaneously programmed in the same manner.

The first memory block 211 includes first through fourth memory cells A1~A4. The first through fourth memory cells A1~A4 are the selected memory cells, that is, the memory cells to be programmed. The first through fourth memory cells A1~A4 are connected with the sub word line SWL. As illustrated in FIG. 8, a program current is simultaneously applied to the first through fourth memory cells A1~A4 during the program operation.

Referring to FIG. 8, each of the first through fourth memory cells A1~A4 includes a diode as a select element. The diode includes a cathode connected with the sub word line SWL. When a voltage difference between an anode and the cathode of the diode is higher than a threshold voltage of the diode, the diode is turned on. When the diode is turned on, a program current is supplied to the memory cells through the bit line BL.

However, when a program current is simultaneously supplied to the first through fourth memory cells A1~A4, the diode may be not fully turned on. This is because a voltage of the sub word line SWL suddenly increases due to a parasitic resistance Rc, a parasitic capacitance (not shown), or the like of the sub word line SWL. That is, electric charges of the sub word line SWL cannot move to a ground through the NMOS transistors N1 and N2 of the first and second word line drivers WD1 and WD2 due to the parasitic resistance Rc, the parasitic capacitance, or the like. When a voltage of the sub word line SWL increases, the program characteristic of the resistance variable memory device becomes worse.

In order to prevent the aforementioned problems, the resistance variable memory device 100 according to the present invention has a structure of the block unit, the column selection unit, and the write driver unit, as illustrated in FIG. 5, which allows for use of the multiprogramming method.

Figure 9:
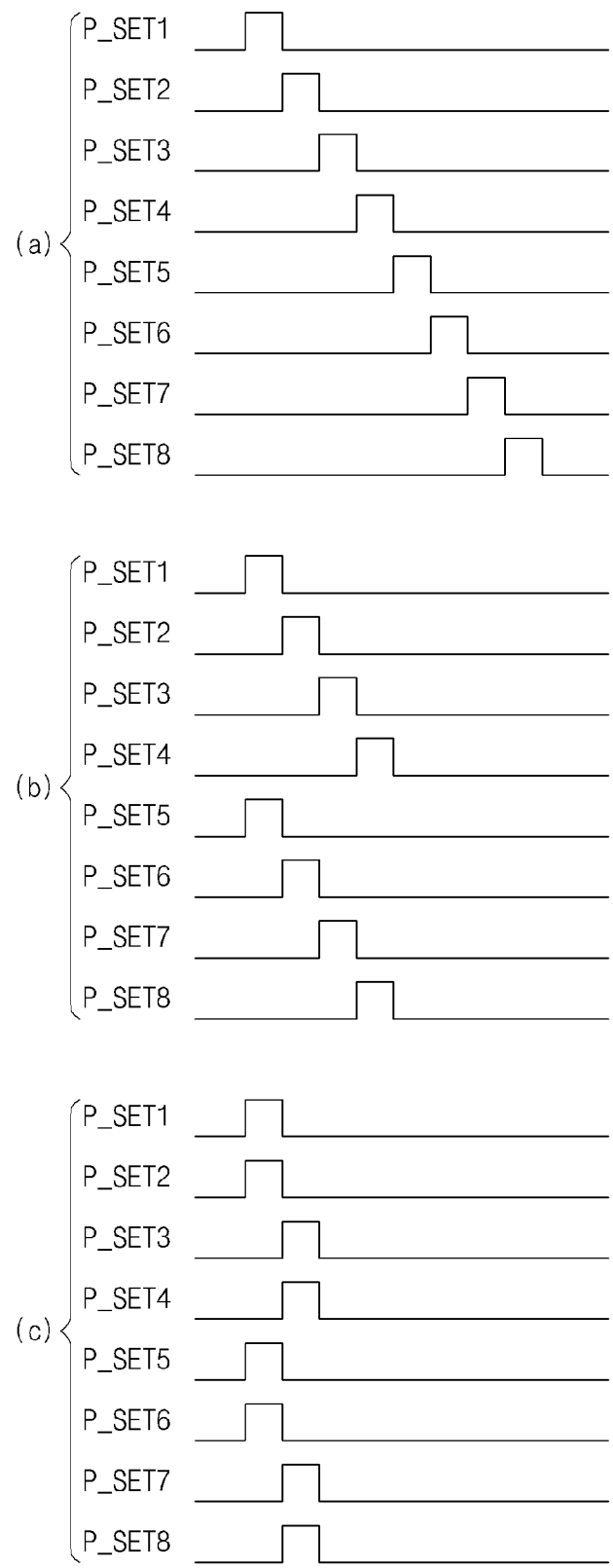
FIG. 9 is a timing diagram illustrating a multiprogramming method of the resistance variable memory device illustrated in FIG. 5.

FIG. 9 is a timing diagram for describing a multiprogramming method of the resistance variable memory device illustrated in FIG. 5. In FIG. 5, the first program pulses P_SET1 and P_RST1 are applied to the first and ninth write drivers W/D1 and W/D9. The second program pulses P_SET2 and P_RST2 are applied to the second and tenth write drivers W/D2 and W/D10 and the eighth program pulses P_SET8 and P_RST8 are applied to the eighth and sixteenth write drivers W/D8 and W/D16 in the same manner. Although FIG. 9 illustrates only the set pulse P_SET, the reset pulse P_SET is applied in the same manner.

FIG. 9(a) illustrates the program pulses applying method according to the x2 programming method. According to the x2 programming method, when the first through fourth program pulses are sequentially applied, the memory cells of the first and third block units 111 and 113 are sequentially programmed. When the fifth through eighth program pulses are applied, the memory cells of the second and fourth block units 112 and 114 are sequentially programmed. That is, the resistance variable memory device 100 can program sequentially 16-bit data 8 times on a 2-bit basis using the x2 programming method.

RIG. 9(b) illustrates the program pulse applying method according to the x4 programming method. According to the x4 programming method, the first and fifth program pulses, the second and sixth program pulses, the third and seventh program pulses, and the fourth and eighth program pulses are simultaneously applied, respectively. For example, when the first and fifth program pulses are applied, the selected memory cells of the first through fourth block units 111~114 are simultaneously programmed. Herein, the one memory cell of each block unit is selected. That is, 4-bit data is simultaneously programmed by applying the program pulses at a time. This will be described in detail with reference to FIG. 10.

FIG. 9(c) illustrates the program pulse applying method according to the x8 programming method. According to the x8 programming method, the first, second, fifth, and sixth program pulses and the third, fourth, seventh, and eighth program pulses are simultaneously applied, respectively. For example, when the first, second, fifth, and sixth program pulses are applied, the selected memory cells of the first through fourth block units 111~114 are simultaneously programmed. Here, two memory cells of each block unit are selected. That is, 8 bit data is simultaneously programmed by applying the program pulses at a time.

Figure 10:
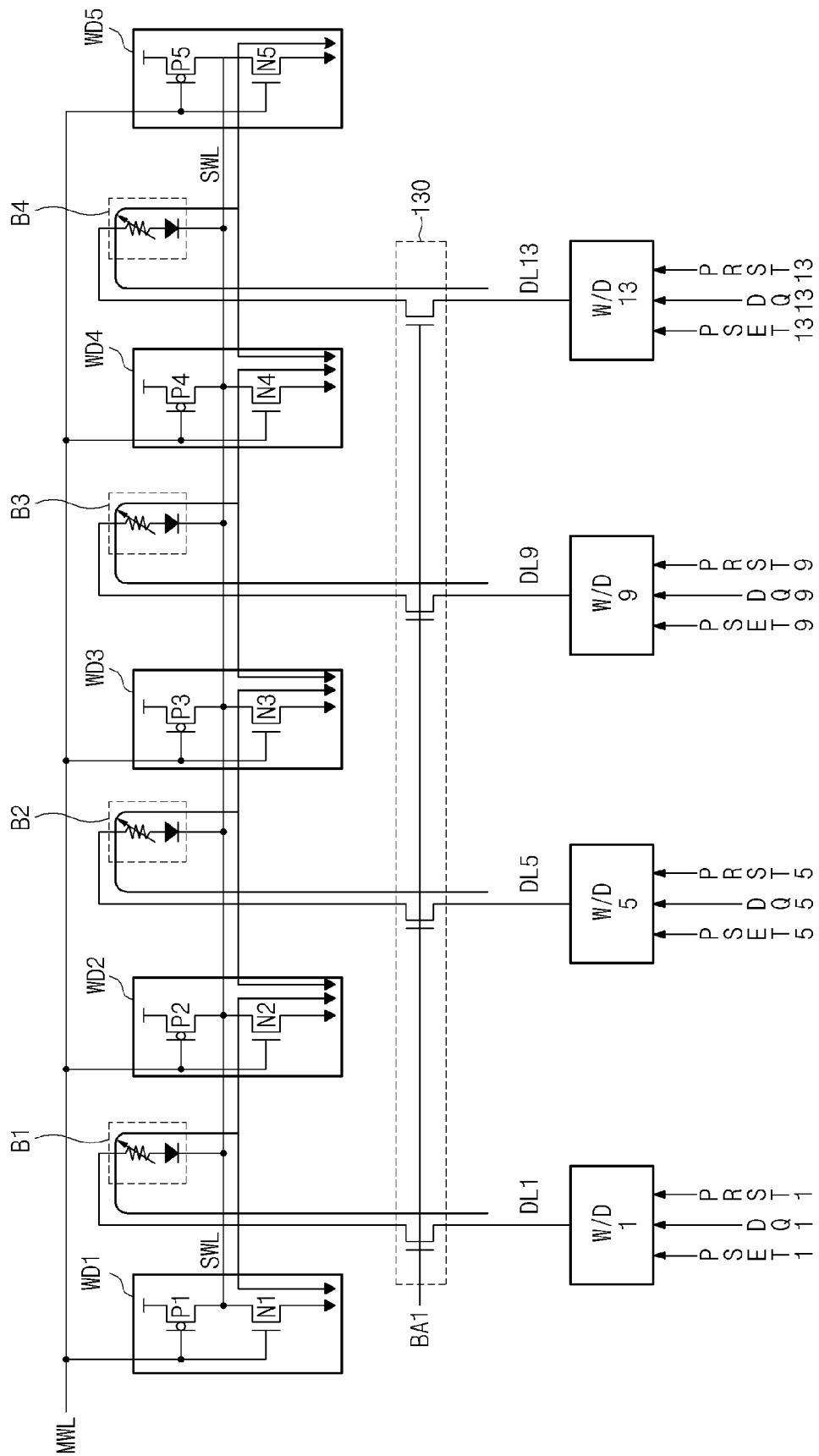
FIG. 10 illustrates that 4-bit data is simultaneously programmed by an x4 programming method illustrated in FIG. 9.

FIG. 10 illustrates the case where 4-bit data is simultaneously programmed by the x4 programming method illustrated in FIG. 9(b). In FIG. 10, the first column selection signal BA1 is activated and 4-bit data is simultaneously programmed in the selected memory cells B1~B4 through the write drivers W/D1, W/D5, W/D9 and W/D13. Herein, each of the memory cells B1~B4 is included in the different block unit with each other. The first memory cell B1, the second memory cell B2, the third memory cell B3, and the fourth memory cell B4 are included in the first block unit 111, the second block unit 112, the third block unit 113, and the fourth block unit 114, respectively.

Referring to FIG. 10, the first memory cell B1 is connected between the first and second word line drivers WD1 and WD2, the second memory cell B2 is connected between the second and third word line drivers WD2 and WD3, the third memory cell B3 is connected between the third and fourth word line drivers WD3 and WD4, and the fourth memory cell B4 is connected between the fourth and fifth word line drivers WD4 and WD5.

When a program current is simultaneously provided to the first through fourth memory cells B1~B4 using the x4 programming method, the sub word line SWL is affected less by a parasitic resistance Rc, a parasitic capacitance, or the like compared with FIG. 8. In FIG. 8, the four memory cells A1~A4 are connected between the first and second word line drivers WD1 and WD2. Therefore, a voltage level of the sub word line SWL is greatly affected by a parasitic resistance Rc, or the like during the program operation, in FIG. 8. On the other hand, in FIG. 10, the one memory cell B1 is connected between the first and second word line drivers WD1 and WD2. Therefore, the sub word line SWL is relatively affected less by a parasitic resistance Rc, or the like.

The resistance variable memory device according to the present invention includes the block unit, the column selection unit, and the write driver unit, as illustrated in FIG. 5. According to the present invention, the word line voltage can be prevented from increasing using the multiprogramming method. This is because the number of the program cells included between the adjacent word line drivers can become smaller during the program operation.

Figure 11:
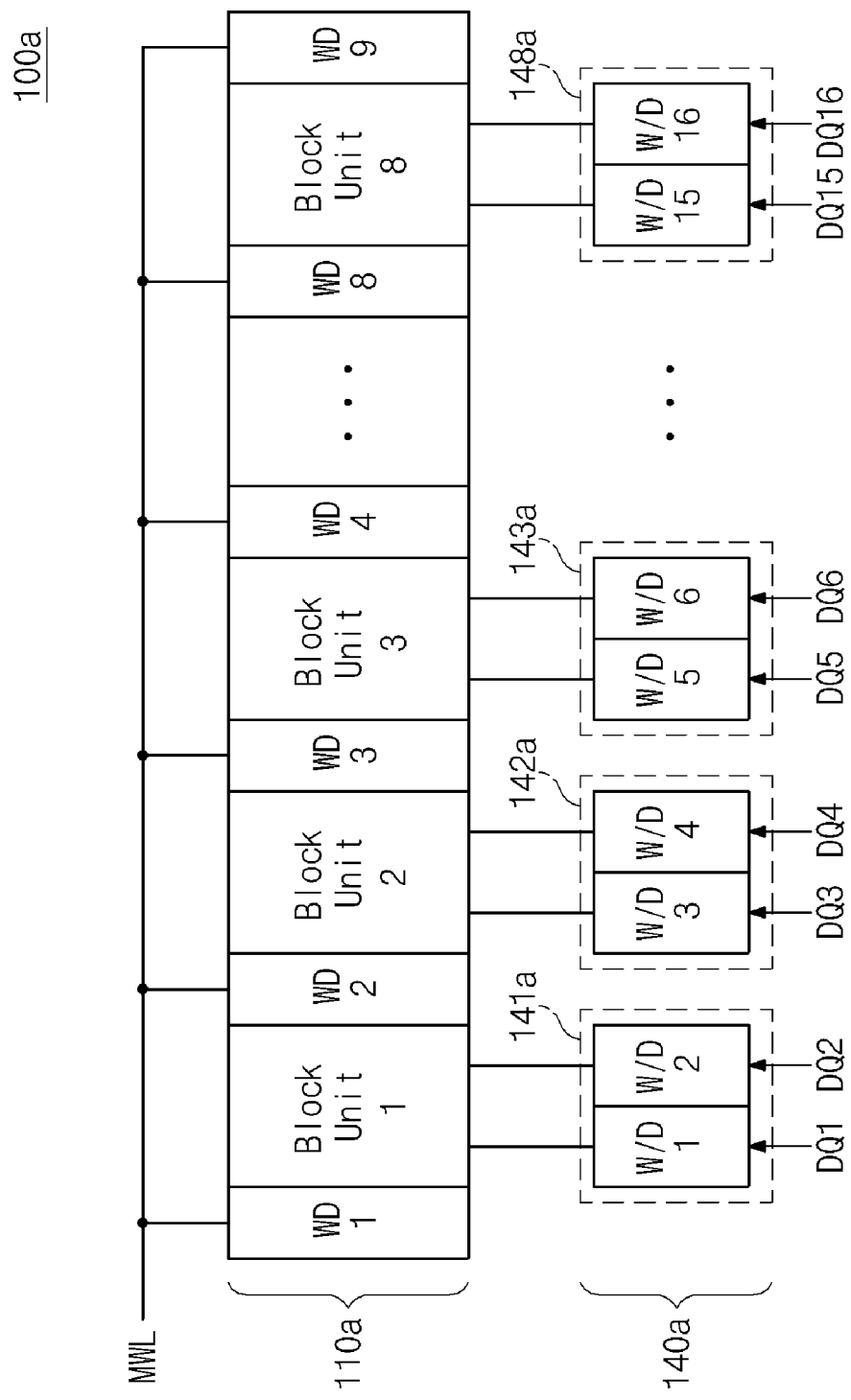
FIGS. 11 and 12 are block diagrams illustrating a programming method of the resistance variable memory device illustrated in FIG. 4, according to another embodiment of the present invention.
Figure 12:
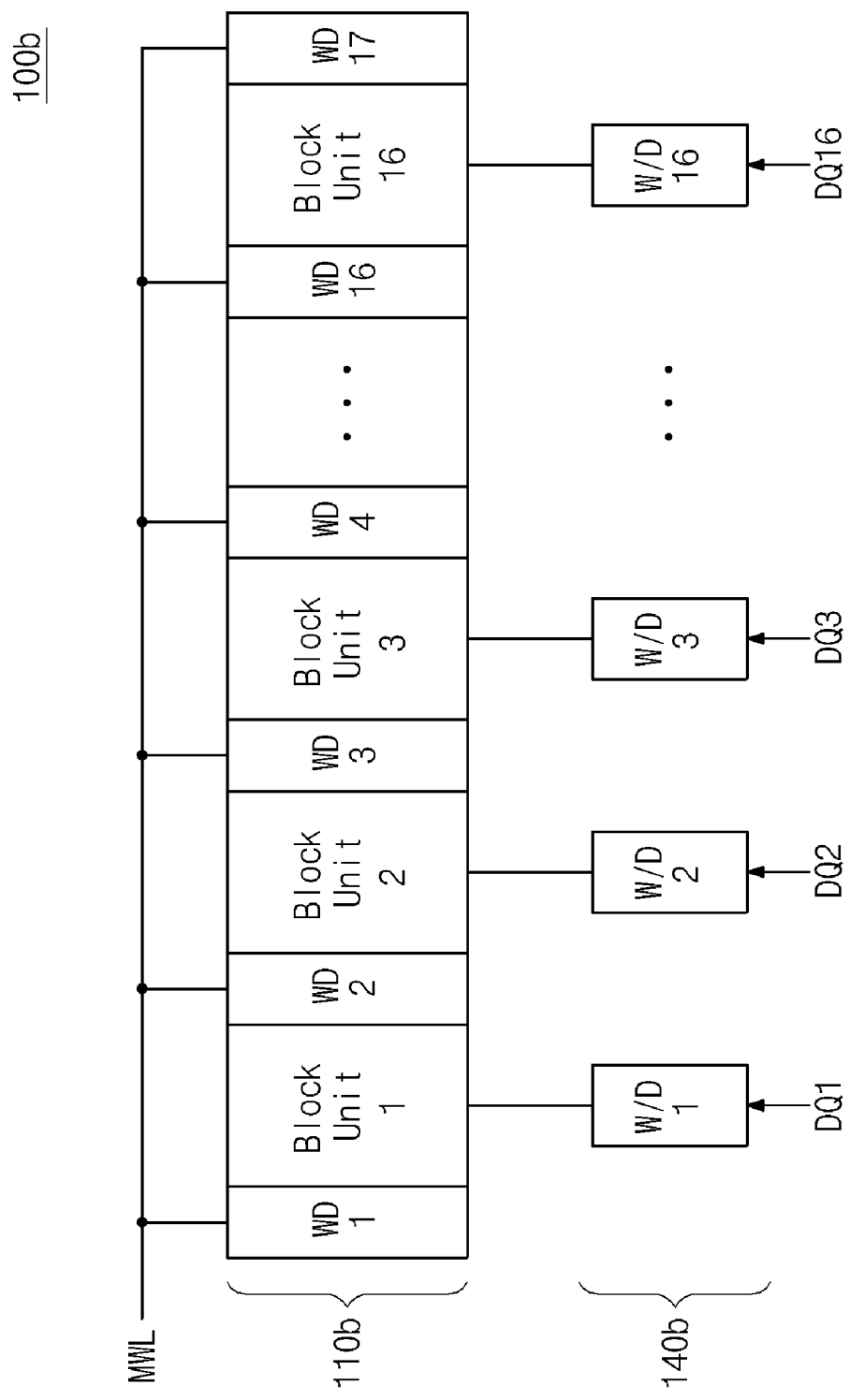

Meanwhile, in the resistance variable memory device 100 according to the present invention, one or two write drivers may be connected with one block unit. FIG. 11 illustrates a structure where two write drivers are connected with one block unit, and FIG. 12 illustrates a structure where one write driver is connected with one block unit.

Referring to FIG. 11, a resistance variable memory device 100a includes a memory cell array 110a and a write driver circuit 140a. The memory cell array 110a includes first through eighth block units and first through ninth word line drivers WD1~WD9. Each block unit is located between the adjacent word line drivers and includes two memory blocks. For example, the first block unit is located between the first and second word line drivers WD1 and WD2 and includes first and second memory blocks.

The write driver circuit 140a includes first through eighth write driver units 141a~148a. Each of the write driver units provides a program current to the corresponding block unit. For example, the first write driver unit 141a provides a program current to the first block unit, and the second write driver unit 142a provides a program current to the second block unit.

Each of the write driver units includes two write drivers. For example, the first write driver unit 141a includes first and second write drivers W/D1 and W/D2. The resistance variable memory device 110a illustrated in FIG. 11 has the same operation principle as the resistance variable memory device 110 illustrated in FIG. 5. The resistance variable memory device 110a can reduce an increase in a word line voltage caused by a parasitic resistance or a parasitic capacitance more than the resistance variable memory device 110. This is because the number of program cells is reduced between word line drivers.

Referring to FIG. 12, a resistance variable memory device 110b includes a memory cell array 110b and a write driver circuit 140b. The memory cell array 110b includes first through sixteenth block units and first through seventeenth word line drivers WD1~WD17. Each of the block units includes one memory block. The write driver circuit 140b includes first through sixteenth write drivers W/D1~W/D16. The resistance variable memory device 110b illustrated in FIG. 12 can reduce an increase in a word line voltage caused by a parasitic resistance or a parasitic capacitance more than the resistance variable memory device 110a illustrated in FIG. 11.

Figure 13:
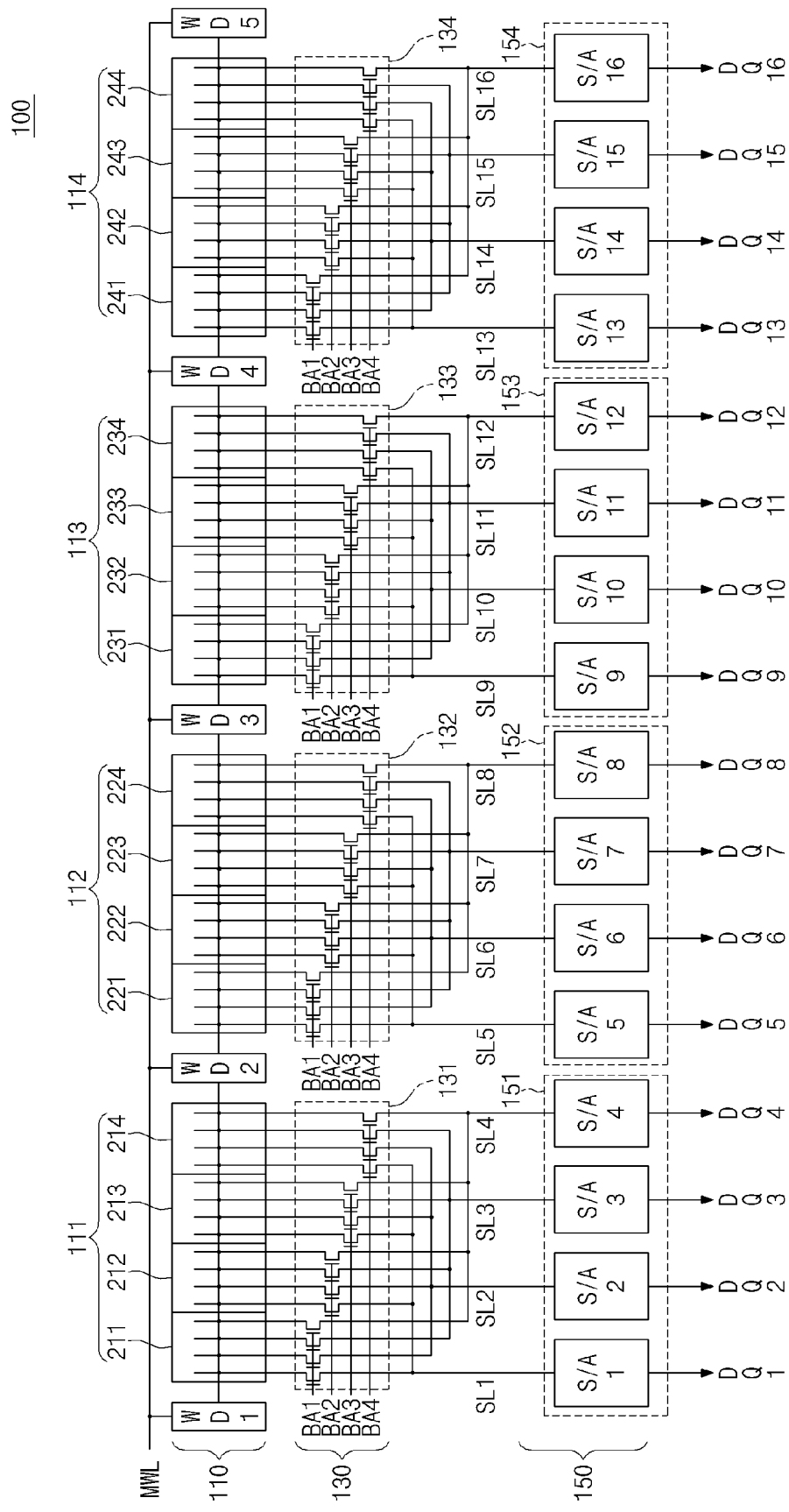
FIG. 13 is a block diagram illustrating a reading method of the resistance variable memory device illustrated in FIG. 4.

FIG. 13 is a block diagram illustrating a reading method of the resistance variable memory device illustrated in FIG. 4. FIG. 13 exemplarily illustrates the memory cell array, the column selection circuit, and the sense amplifier circuit illustrated in FIG. 4.

Referring to FIG. 13, the memory cell array 110 includes the first through fourth block units 111~114 and the first through fifth word line drivers WD1~WD5. Each block unit includes fourth memory blocks. The column selection circuit 130 is connected between the bit line BL and the sensing line SL. The column selection circuit 130 electrically connects the sensing line SL with the selected bit line BL in response to the column selection signal BA1. The column selection circuit 130 includes the first through fourth column selection units 131~134. The first through fourth column selection units 131~134 are connected with the first through fourth block units 111~114, respectively.

The sense amplifier circuit 150 provides a read current (or a bias current) to a memory cell through the sensing line SL, and compares a voltage of the sensing line SL with a reference voltage to read data stored in the memory cell during a sensing operation. Referring to FIG. 13, the sense amplifier circuit 150 includes first through fourth sense amplifier units 151~154. Each of the sense amplifier units provides a read current to the corresponding block unit. For example, the first sense amplifier unit 151 provides a read current to the first block unit 111, and the second sense amplifier unit 152 provides a read current to the second block unit 112.

Each sense amplifier unit includes fourth sense amplifiers. For example, the first sense amplifier unit 151 includes first through fourth sense amplifiers S/A1~S/A4. Each sense amplifier has the same construction and operation principle as each other.

According to a typical reading method, when a current is simultaneously provided to memory cells, a voltage of the sub word lien SWL may increase due to a parasitic resistance Rc, a parasitic capacitance (not shown), or the like of the sub word line SWL. As a voltage of the sub word lien SWL increases, the read characteristic of the resistance variable memory device is degraded.

A read current is simultaneously provided to more memory cells in a read operation compared with a program operation. Here, when a voltage of the sub word line increases, a set resistance distribution of memory cells moves to a reset resistance distribution. Due to such a mechanism, a sensing margin of the memory cell decreases, and the read characteristic of the resistance variable memory device is degraded.

In this regard, the resistance variable memory device 100 according to the present invention has a structure of the block unit, the column selection unit, and the sense amplifier unit, as illustrated in FIG. 13. That is, the memory block is divided into a plurality of block units, and a word line driver is disposed between the block units to minimize an increase in a word line voltage. This is because, as described with reference to FIG. 5, the number of memory cells included between adjacent word line drivers is reduced in a read operation.

Figure 14:
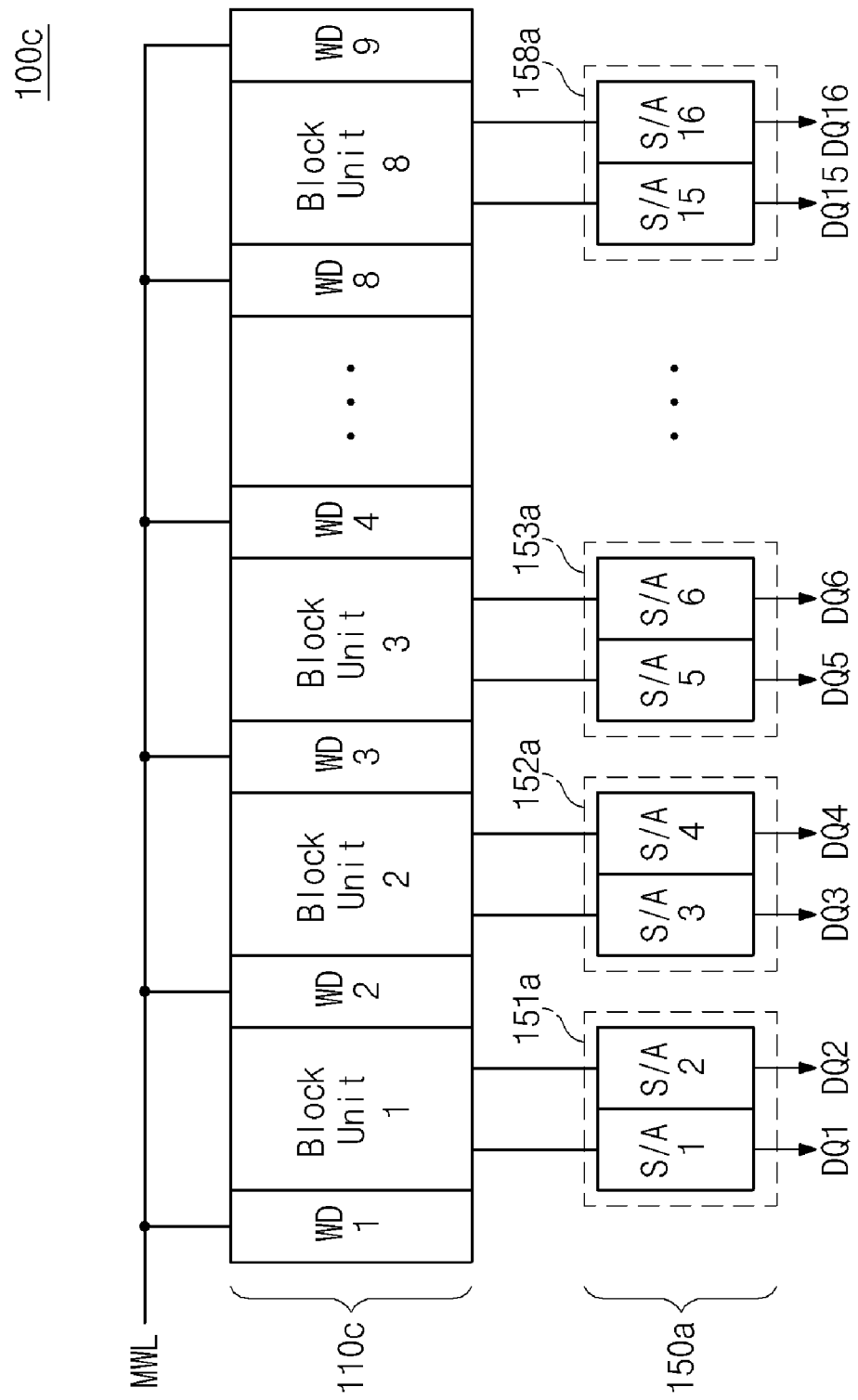
FIGS. 14 and 15 are block diagrams illustrating a reading method of the resistance variable memory device illustrated in FIG. 4, according to another embodiment of the present invention.
Figure 15:
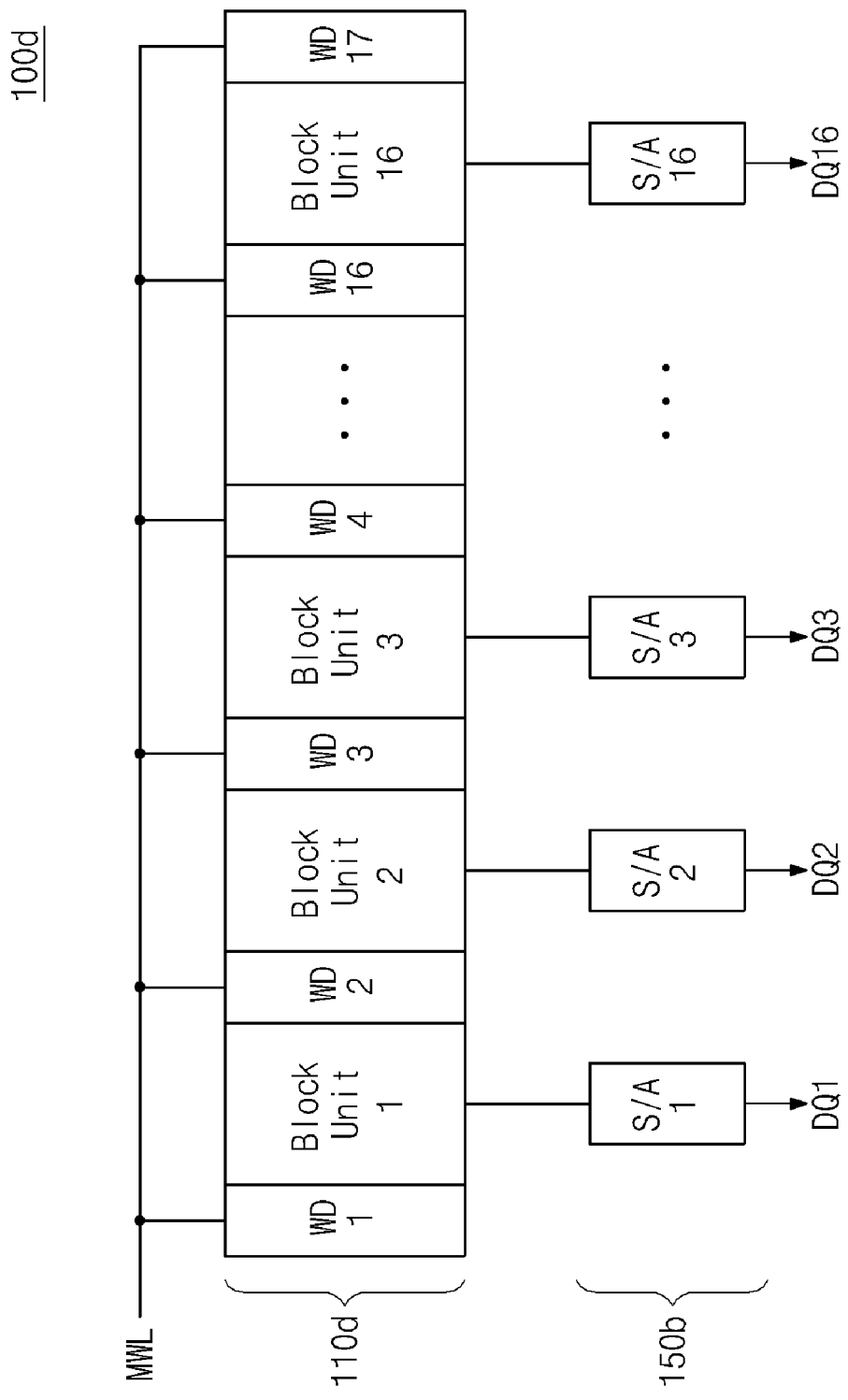

Meanwhile, in the resistance variable memory device 100 according to the present invention, one or two sense amplifiers may be connected with one block unit. FIG. 14 illustrates a structure where two sense amplifiers are connected with one block unit, and FIG. 15 illustrates a structure where one sense amplifier is connected with one block unit.

Referring to FIG. 14, a resistance variable memory device 100c includes a memory cell array 110c and a sense amplifier circuit 150a. The memory cell array 110c includes first through eighth block units and first through ninth word line drivers WD1~WD9. Each block unit is located between the adjacent word line drivers and includes two memory blocks. For example, the first block unit is located between the first and second word line drivers WD1 and WD2 and includes first and second memory blocks.

The sense amplifier circuit 150a includes first through eighth sense amplifier units 151a~158a. Each of the sense amplifier units provides a read current to the corresponding block unit. For example, the first sense amplifier unit 151a provides a read current to the first block unit, and the second sense amplifier unit 152a provides a read current to the second block unit.

Each sense amplifier unit includes two sense amplifiers. For example, the first sense amplifier unit 151a includes first and second sense amplifiers S/A1 and S/A2. The resistance variable memory device 110c illustrated in FIG. 14 has the same operation principle as the resistance variable memory device 110 illustrated in FIG. 13. The resistance variable memory device 110c can reduce an increase in a word line voltage caused by a parasitic resistance or a parasitic capacitance more than the resistance variable memory device 110.

Referring to FIG. 15, a resistance variable memory device 100d includes a memory cell array 110d and a sense amplifier circuit 150b. The memory cell array 110d includes first through sixteenth block units and first through seventeenth word line drivers WD1~WD17. Each block unit includes one memory block. The sense amplifier circuit 150b includes first through sixteenth sense amplifiers S/A1~S/A16. The resistance variable memory device 110d illustrated in FIG. 15 can reduce an increase in a word line voltage caused by a parasitic resistance or a parasitic capacitance more than the resistance variable memory device 110c illustrated in FIG. 14.

Figure 16:
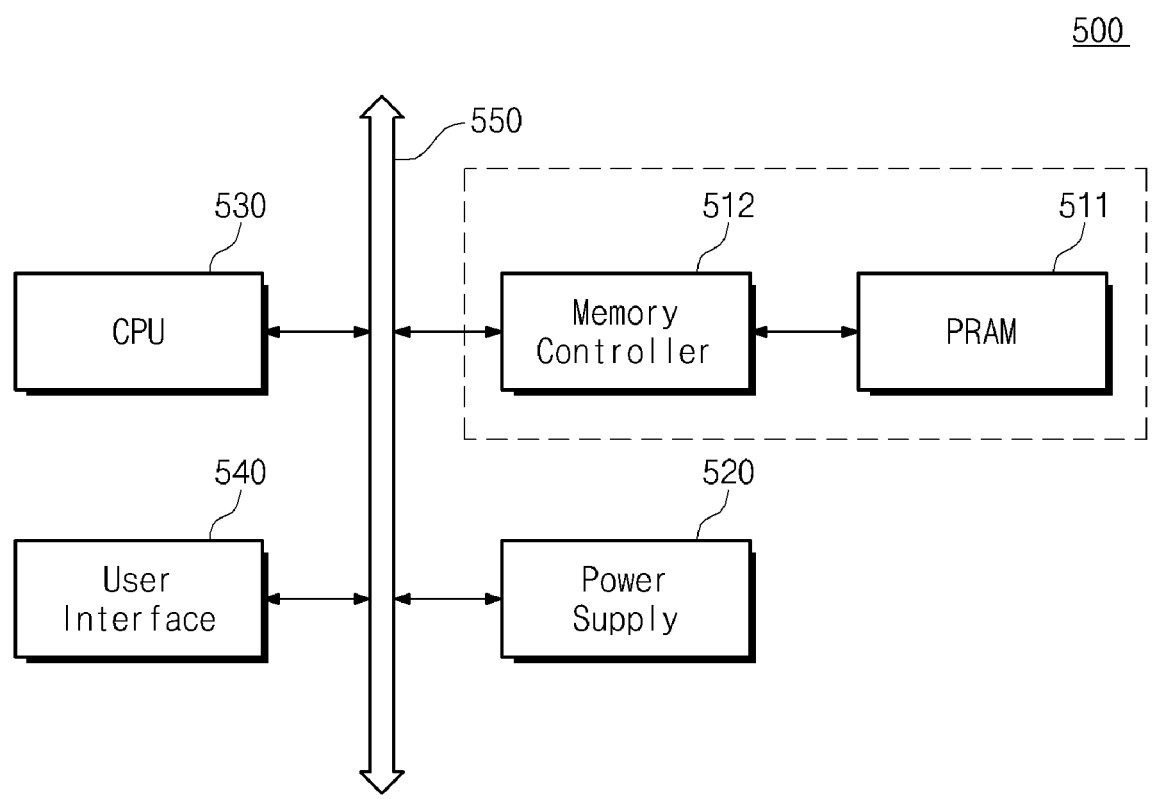
FIG. 16 is a block diagram of a memory system including a resistance variable memory device according to the present invention.

FIG. 16 is a block diagram of a memory system 500 including a resistance variable memory device according to the present invention. Referring to FIG. 16, the memory system 500 includes a semiconductor memory device 510 including a resistance variable memory device 511 and a memory controller 512, a central processing unit (CPU) 530 electrically connected with a system bus 550, a user interface 540, and a power supply 520.

Data provided through the user interface 540 or processed by the CPU 530 is stored in the resistance variable memory device 511 through the memory controller 512. The semiconductor memory device 510 may include a semiconductor disk device (SSD).

Although not shown, it is obvious to those skilled in the art that an application chipset, a camera image processor (CIS), a mobile DRAM, or the like may be further provided to the memory system according to the present invention.

The resistance variable memory device according to the present invention can reduce an increase in a word line voltage caused by a parasitic resistance or a parasitic capacitance, or the like during a program or read operation. In addition, the resistance variable memory device can prevent the degradation of the program or read characteristic caused by an increase in a voltage of the word line during the program operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resistance variable memory device, comprising:
a memory cell array comprising a plurality of block units and a plurality of word line drivers, each of the block units connected between adjacent word line drivers and including a plurality of memory blocks;
a sense amplifier circuit comprising a plurality of sense amplifier units, each of the sense amplifier units providing a read current to a corresponding block unit and including a plurality of sense amplifiers; and
a column selection circuit connected between the memory cell array and the sense amplifier circuit and selecting at least one of the plurality of memory blocks in response to a column selection signal to apply the read current from the sense amplifier circuit to the selected memory block.

2. The resistance variable memory device of claim 1, wherein the word line drivers are connected between a main word line and a sub word line and drive the sub word line according to a voltage level of the main word line.

3. The resistance variable memory device of claim 2, wherein each of the word line drivers includes a PMOS transistor and an NMOS transistor that include respective gates connected with the main word line and respective sources connected with the sub word line.

4. The resistance variable memory device of claim 2, wherein each of the memory blocks includes a plurality of memory cells connected with the sub word line.

5. The resistance variable memory device of claim 4, wherein each of the memory cells comprises a memory element including a variable resistance material and a select element for selecting the memory cell, wherein the select element includes a diode connected between the memory element and the sub word line.

6. The resistance variable memory device of claim 1, wherein the column selection circuit includes a plurality of column selection units, and each of the column selection units is connected between a corresponding block unit and a corresponding sense amplifier unit.

7. The resistance variable memory device of claim 6, wherein each of the column selection units includes a plurality of NMOS transistors which are turned on and off in response to the column selection signal.

* * * * *